United States Patent [19]

Horl

[11] Patent Number: 4,458,210
[45] Date of Patent: Jul. 3, 1984

[54] DISTORTION COMPENSATED CROSS-COUPLED DIFFERENTIAL AMPLIFIER CIRCUIT

[75] Inventor: Manfred Horl, Hamburg, Fed. Rep. of Germany

[73] Assignee: U.S. Philips Corporation, New York, N.Y.

[21] Appl. No.: 276,597

[22] Filed: Jun. 23, 1981

[30] Foreign Application Priority Data

Jun. 27, 1980 [DE] Fed. Rep. of Germany ....... 3024142

[51] Int. Cl.³ .............................................. H03G 3/30
[52] U.S. Cl. .................................... 330/254; 307/529; 328/160
[58] Field of Search ........................ 330/254; 358/27; 307/492, 529; 328/160

[56] References Cited

U.S. PATENT DOCUMENTS 4,331,929 5/1982 Yokoyama ......................... 330/254
4,353,000 10/1980 Noda ............................. 307/492 X Primary Examiner—James B. Mullins
Attorney, Agent, or Firm—Robert T. Mayer; Bernard Franzblau

[57] ABSTRACT

The invention relates to a circuit arrangement comprising two identical amplifier circuits which each comprise two cross-coupled transistor pairs. The input signal is applied to the transistor pairs of the two amplifier circuits with equal amplitude but opposite phase, and the output signals are subtracted from each other. As a result the fundamentals and the odd harmonics in the output currents of the two amplifier circuits are added to each other, whereas the even harmonics, in particular the second harmonics, cancel each other.

8 Claims, 2 Drawing Figures

DISTORTION COMPENSATED CROSS-COUPLED DIFFERENTIAL AMPLIFIER CIRCUIT

BACKGROUND OF THE INVENTION

This invention relates to a circuit arrangement comprising a first amplifier circuit which includes two cross-coupled differential amplifiers each of which comprises two transistors having a common emitter branch to which input signals are applied. One transistor of each differential amplifier is connected to the output of the amplifier circuit via its collector.

A circuit with two cross-coupled differential amplifiers comprises four transistors, each of which has one electrode (emitter, collector or base) connected in common with a corresponding electrode of only one transistor of the three other transistors. In particular such cross-coupled differential amplifiers are used on a large scale in integrated circuit technology. However, it is known that they may give rise to non-linear distortion, which in some cases becomes impermissible.

It is known that non-linear distortion may be reduced by negative feedback.

In a volume or a tone-control circuit comprising two cross-coupled differential amplifiers, as is known from U.S. Pat. No. 3,908,172, the negative feedback depends on the desired volume or the desired frequency response respectively. The negative feedback may become so small over a part of the adjustment range that the non-linear distortion can no longer be eliminated to a satisfactory extent.

It is furthermore known that the emitter-path resistances of the transistors of the cross-coupled differential amplifiers cause said distortion and that the non-linearities can be minimized if the emitter-path resistances are minimized (DE-OS 24 18 455). However, when use is made of integrated circuit technology this solution demands a substantial surface area.

SUMMARY OF THE INVENTION

The invention is based on the recognition that the non-linearities occurring in circuits of the type mentioned in the opening paragraph are caused by the even harmonics, in particular the second harmonic (which is a wave of twice the frequency of the fundamental wave). It is an object of the invention to provide a circuit arrangement of the type mentioned in the opening paragraph in which the non-linear distortion is reduced by compensation of the even harmonics.

According to the invention this object is achieved in that there is provided a second, identical amplifier circuit and that there are provided two inverter circuits via which the emitter branches of the differential amplifiers of the second amplifier circuit receive the same quiescent current. The input signal is applied in phase opposition with respect to the corresponding emitter branches in the first amplifier circuit, and that also provided is a subtractor circuit which forms the difference of at least the signal components at the outputs of the first and the second amplifier circuit and which has an output at which the output signal of the circuit arrangement is available.

Since the emitter branches of the two differential amplifiers of the second amplifier circuit receive the input signal in phase opposition relative to the emitter branches of the two differential amplifiers in the first amplifier circuit, the quiescent current setting for all emitter branches being the same, the fundamental wave and all odd harmonics (that is all waves of three, five, seven etc. times the frequency of the fundamental wave) at the output of the second amplifier circuit have a phase opposite to that at the output of the first amplifier circuit. By means of the subtractor circuit, which forms the difference of the output signals of the two amplifier circuits, the signal components of the fundamental frequency are added to each other. The even harmonics, of which the second harmonic (that is a wave of twice the frequency of the fundamental) is particularly pronounced, appear in phase at the outputs of the two amplifier circuits so that they are eliminated by the subtractor circuit. In this way the non-linear distortion is substantially reduced.

A further advantage of the circuit arrangement in accordance with the invention is the independence of the d.c. output voltage of the base voltages of the transistors of the two differential amplifiers. In the case of cross-coupled differential amplifiers the direct current in the emitter branches and thus the d.c. output voltage may vary if the base bias of the differential amplifier transistors is varied and if the emitter branches do not include constant-current sources, but for example resistor combinations. In the circuit arrangement in accordance with the invention this shift of the operating point is equal for both amplifier circuits, but is cancelled by means of the subtractor circuit.

BRIEF DESCRIPTION OF THE DRAWINGS

The invention will now be described in more detail with reference to the drawing in which.

DETAILED DESCRIPTION OF THE PREFERRED EMBODIMENT

Figure 1:
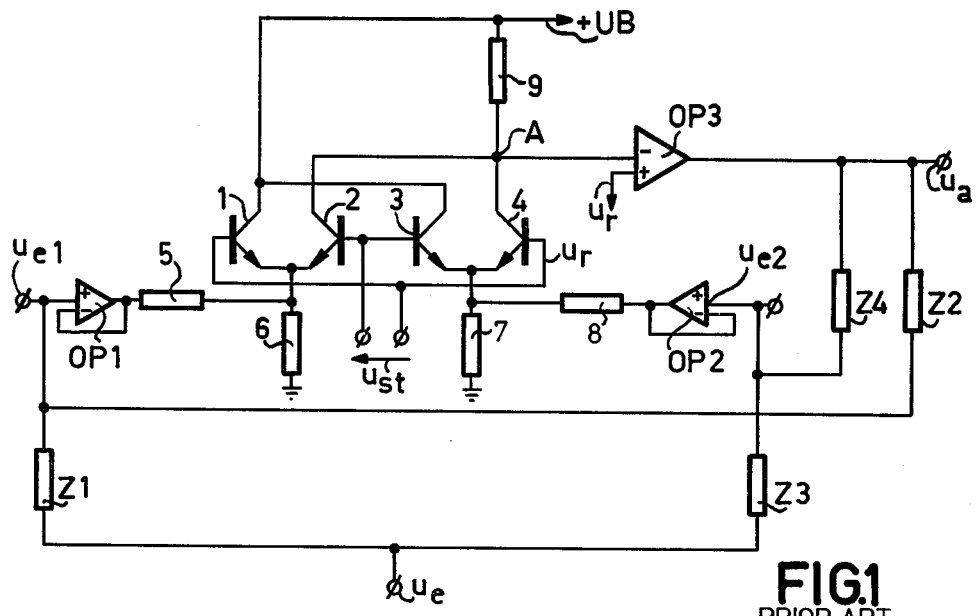
FIG. 1 shows one of the two amplifier circuits, and which are known per se.

The circuit arrangement of FIG. 1 comprises two differential amplifiers consisting of npn-transistors 1, 2, 3 and 4. Each electrode of the four transistors is connected to the corresponding electrode of one of the three other transistors. The collector electrodes of the transistors 2 and 4 are connected to a positive supply voltage via a common resistor 9 and the collector electrodes of the transistors 1 and 3 are interconnected and connected to the positive supply voltage $+U_B$. The common emitter connection of the transistors 1 and 2 is connected to ground via a first resistor 6 and to the output of a voltage follower OP1 via a second resistor 5. Similarly, the common emitter connection of the transistors 3 and 4 is connected to ground via a resistor 7 and to the output of a voltage follower OP2 via a resistor 8. The resistor 6 has the same value as the resistor 7 and the resistor 5 has the same value as the resistor 8. The two voltage followers OP1 and OP2 have the same characteristics.

The junction point A of the collectors of the transistors 2 and 4 and of the resistor 9 is connected to the inverting input of a high-gain amplifier OP3. The output of this amplifier is fed back to the input of the voltage follower OP1 via an impedance $Z_2$ and to the input of the voltage follower OP2 via an impedance $Z_4$. The input signal $u_e$ is applied to the input of the voltage follower OP1 via an impedance $Z_1$ and to the input of the voltage follower OP2 via an impedance $Z_3$.

Depending on whether the circuit is to be used for volume control or for tone control, the impedances $Z_1 \ldots Z_4$ have different values and/or a different frequency dependence. Volume or tone control is effected by varying the voltage $U_{st}$ which is applied across the junction points of the bases of the transistors 2 and 3 and the bases of the transistors 4 and 5. One of these two junction points has the same voltage $u_r$ relative to ground as the non-inverting input of the amplifier OP3, which voltage is suitably equal to half the supply voltage $U_B$.

So far, the circuit is in principle similar to these shown in DE-OS 22 62 098 and DE-OS 24 04 331. However, in these circuits the emitter lines include transistor constant-current sources which supply a current to the emitters of the transistors of the differential amplifiers which is independent of the control voltage $u_{st}$. Such a transistor constant-current source produces more noise than the respective resistor networks 5, 6 and 7, 8 included in the emitter lines, which therefore have the drawback that the current supplied by them depends on the control voltage $u_{st}$. As a result, the potential at point A and thus the output voltage $u_a$ varies with the control voltage.

Figure 2:
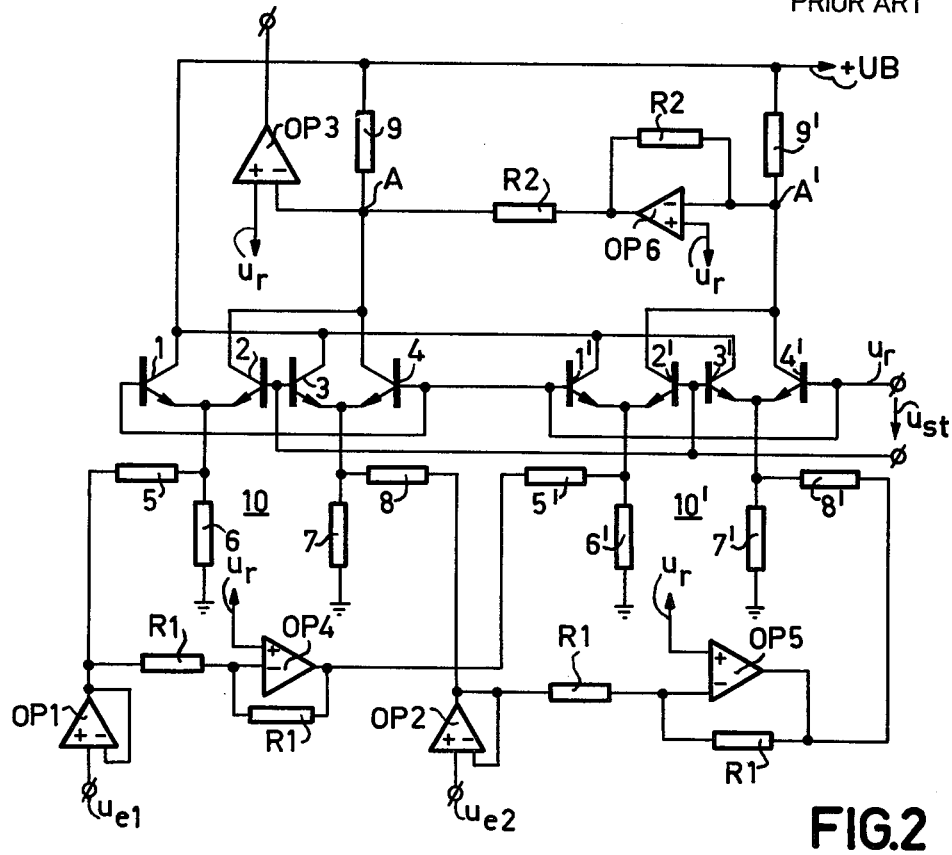
FIG. 2 shows an amplifier circuit in accordance with the invention.

The circuit arrangement shown in FIG. 2 comprises the amplifier circuit 10 with the components 1 ... 9 described with reference to FIG. 1 as well as a second identical amplifier circuit 10' with the components 1' ... 9'. The bases of corresponding transistors 1, 1'; 2, 2' etc. are interconnected. The signals $u_{e1}$ and $u_{e2}$, derived from the input voltage $u_e$ via the impedances $Z_1$ and $Z_3$—compare FIG. 1—and from the output voltage $u_a$ of the amplifier OP3 (via the impedances $Z_2$ and $Z_4$—compare FIG. 1), are applied to the emitter branches of the amplifier circuit 10—in the same way as in the circuit of FIG. 1—via the voltage followers OP1 and OP2, whereas they are applied to the emitter branches of the second amplifier circuit 10' each via an inverter circuit.

These inverter circuits ensure that the signal voltage at the terminals of the resistors 5' and 8' connected thereto is in phase opposition relative to the signal voltage at the corresponding terminals of the resistors 5 and 8; the operating points for the corresponding emitter branches being equal. Each of the inverter circuits comprises an operational amplifier OP4 and OP5 respectively, from whose output negative feedback is applied to its inverting input via a resistor $R_1$. The inverting input is moreover connected to the output of the voltage follower OP1 or OP2 via a resistor $R_1$ which has the same value as the feedback resistor. At the non-inverting input a constant voltage $u_r$ appears, which also appears at the bases of the transistors 1, 4; 1', 4'.

The outputs A and A' of the two amplifier circuits 10 and 10' are connected via a subtractor circuit so that the signal component of the voltage or current at output A' is superimposed on the voltage or current at the output A with opposite phase. The subtractor circuit comprises an operational amplifier OP6 having a non-inverting input connected to the constant reference voltage $u_r$. The output of the operational amplifier OP6 is connected to the output A of the amplifier circuit 10 via a resistor $R_2$ and to the output A' of the amplifier 10' or to the inverting input of the amplifier OP6 via a further resistor of equal value. The amplifier OP6 in conjunction with the feedback resistor $R_2$ ensures that a variation of the sum of the collector currents of the transistors 2' and 4' is converted into a proportional voltage variation of opposite phase at the output of the circuit OP6 (low impedance). This voltage variation of opposite phase is converted into a current variation of opposite phase by means of the resistor $R_2$, which current variation is superimposed on the variation of the sum of the collector currents 2 and 4 at point A.

In the rest condition (input signal $u_e=0$) the voltage at the outputs A, A' as well as the voltage at the inputs of the voltage followers OP1 and OP2 and on those terminals of the resistors 5, 5' and 8, 8' which are remote from the emitters corresponds to the constant reference voltage $u_r$. If a sinewave input signal $u_e$ is applied, this not only results in signal components of the fundamental frequency in the amplifier circuits 10 and 10', but owing to the non-linearities higher harmonics of the fundamental are produced, especially harmonics of twice the frequency. Whereas the fundamental components (and all odd harmonics) in the two amplifier circuits 10 and 10' are in phase opposition and are consequently superimposed with the same phase by the subtractor circuit on the outputs of the two amplifier circuits, the even harmonics, especially the pronounced second harmonic, in the two amplifier circuits are in phase so that they cancel each other at the output of the subtractor circuit, i.e. at the output A of the first amplifier circuit 10.

For a correct compensation it is necessary that the two inverter circuits and the subtractor circuit introduce no additional non-linear distortion. However, this requirement can readily be met because the inverter circuits and the subtractor circuit may be subjected to such a strong negative feedback by means of the amplifiers OP4 ... OP6 that they produce no significant distortion.

The circuit arrangement in accordance with the invention not only compensates for the even harmonics produced in the amplifier circuit 10, but also for direct voltage variations at the output A, which may arise as a result of temperature variations or otherwise. If, for example, the control voltage $u_{st}$ across the bases of the transistors 1 ... 4 is varied, the emitter direct currents and thus the collector direct currents will also vary slightly. The same direct current variation also occurs in the amplifier circuit 10' and this direct current variation is converted into a current variation of opposite phase by the subtractor circuit at the outputs A and A' and is superimposed on the direct current variation at output A of the amplifier circuit 10, so that these opposite direct current variations compensate each other.

What is claimed is:

1. A circuit arrangement comprising a first amplifier circuit including a first and a second differential amplifier with the first differential amplifier comprising first and second transistors with interconnected emitters and the second differential amplifier comprising third and fourth transistors with interconnected emitters, means coupling an output of the first amplifier circuit to a collector of one transistor of each of the first and second differential amplifiers, a source of control voltage coupled between the base electrodes of the first and second transistors, means connecting the base electrode of the third transistor to the base electrode of the second transistor and the base electrode of the fourth transistor to the base electrode of the first transistor, a second identical amplifier circuit comprising a third and a fourth differential amplifier with the third differential amplifier comprising fifth and sixth transistors with interconnected emitters and the fourth differential amplifier comprising seventh and eighth transistors with interconnected emitters, means coupling an output of the second amplifier circuit to a collector of one transistor of each of the third and fourth differential amplifiers, means coupling the base electrode of the sixth transistor to the base electrode of the seventh transistor and to the base electrode of the second transistor and the base electrode of the eighth transistor to the base electrode of the fifth transistor and to the base electrode of the first transistor, means including first and second inverter circuits for applying the same quiescent currents to the emitter branches of the third and fourth differential amplifiers, respectively, means for applying an input signal to the emitter branches of the first and second differential amplifiers, means for applying said input signal to the emitter branches of the third and fourth differential amplifiers in phase opposition to the input signal at the emitter branches of the first and second differential amplifiers, respectively, and a subtractor circuit coupled to said outputs of the first and second amplifier circuits so as to form the difference of the signal components at said outputs of the first and second amplifier circuits to derive an output signal of the circuit arrangement.

2. A circuit arrangement as claimed in claim 1 wherein the subtractor circuit inverts the signal components at the output of one amplifier circuit and adds it to the signal components at the output of the other amplifier circuit.

3. A circuit arrangement as claimed in claim 2, wherein the subtractor circuit comprises an amplifier having an inverting input connected to the output of the one amplifier circuit and a first resistor connected between an output of the amplifier and said inverting input thereof, means for applying a reference voltage to the non-inverting input which corresponds to the quiescent potential at the output of the one amplifier circuit, and means connecting the output of the amplifier to the output of the other amplifier circuit via a second resistor which has the same value as said first resistor, and wherein the output of the other amplifier Circuit constitutes the output of the subtractor circuit.

4. A circuit arrangement as claimed in any one of claims 1, 2 or 3 further comprising, means connecting the output of the subtractor circuit to the emitter branch of a differential amplifier of the first amplifier circuit via a first negative feedback path and to the emitter branch of the corresponding differential amplifier of the second amplifier circuit via one of the inverter circuits, and means connecting the output of the subtractor circuit to the emitter branch of the other differential amplifier of the first amplifier circuit via a second negative feedback path and to the emitter branch of the corresponding differential amplifier of the second amplifier circuit via the other inverter circuit.

5. A circuit arrangement as claimed in claim 4, characterized in that the source of control voltage is variable.

6. A circuit arrangement comprising a first amplifier circuit including at least a first differential amplifier circuit comprising first and second transistors with their emitter electrodes interconnected, a second amplifier circuit including at least a second differential amplifier circuit comprising third and fourth transistors with their emitter electrodes interconnected, means including an inverter circuit for cross-coupling said first and second amplifier circuits so that the emitter branches of the first and second amplifier circuits receive the same quiescent currents, means including a signal input terminal for applying an input signal to the emitter branches of the first and second amplifier circuits in phase opposition whereby first and second output signals appear at first and second output electrodes of the first and second amplifier circuits, respectively, in which the fundamental frequency components are out of phase and second harmonic components are in phase, said first amplifier circuit further comprising a third differential amplifier circuit comprising fifth and sixth transistors with their emitter electrodes interconnected and their base and collector electrodes coupled to respective base and collective electrodes of the first differential amplifier circuit, said second amplifier circuit further comprising a fourth differential amplifier circuit comprising seventh and eighth transistors with their emitter electrodes interconnected and their base and collector electrodes coupled to respective base and collector electrodes of the second differential amplifier circuit, and wherein said cross-coupling means includes a second inverter circuit for coupling the emitter branch of the fourth differential amplifier circuit to the emitter branch of the third differential amplifier circuit whereby said emitter branches receive the same quiescent currents but receive said input signal in phase opposition, and means coupled to said first and second output electrodes for subtractively combining said first and second output signals to derive an output signal for the circuit arrangement which contains said fundamental frequency component and in which said second harmonic components cancel one another.

7. A circuit arrangement as claimed in claim 6 further comprising an amplifier coupling said output signal to an output terminal of the circuit arrangement, and first and second negative feedback circuits having different transfer characteristics for coupling said output terminal directly to the emitter branches of the first and third differential amplifier circuits and via said first and second inverter circuits to the emitter branches of the second and fourth differential amplifier circuits.

8. A circuit arrangement as claimed in claim 7 further comprising a source of variable control voltage coupled to base electrodes of the transistors of said first, second, third and fourth differential amplifier circuits.

* * * * *